United States Patent [19]
Suzuki et al.

[11] Patent Number: 5,948,536
[45] Date of Patent: Sep. 7, 1999

[54] GLASS COMPOSITION FOR SUBSTRATES WITH A BUILT-IN LEAD BASE DIELECTRIC MATERIAL, AND MULTILAYER SUBSTRATE WITH A BUILT-IN CAPACITOR

[75] Inventors: Yasuyoshi Suzuki; Hiroshi Tsuyuki, both of Chiba, Japan

[73] Assignee: TDK Corporation, Tokyo, Japan

[21] Appl. No.: 08/851,276

[22] Filed: May 5, 1997

[30] Foreign Application Priority Data

May 10, 1996 [JP] Japan ..................................... 8-116716
Nov. 13, 1996 [JP] Japan ..................................... 8-301473

[51] Int. Cl.$^6$ ..................................................... B32B 17/00
[52] U.S. Cl. ........................... 428/426; 428/432; 428/469; 428/472; 428/701; 428/702; 501/73; 501/74
[58] Field of Search ..................................... 428/426, 432, 428/469, 472, 701, 702; 501/73, 74

[56] References Cited

FOREIGN PATENT DOCUMENTS 8-298365  11/1996  Japan .

OTHER PUBLICATIONS

Hideto Kamiaka, "Low Temperature Cofired Multilayer Ceramic Substrate with Burid Capacitors," Central Research Laboratory, Nihon Cement Co., Ltd., vol. 6, No. 1, 1991, pp. 28–34.

Y. Inoue, et al., "Multilayer Ceramic Wiring Substrate Having C and R Built Therein and Experimental Manufacture of its Application," 1$^{st}$ Microelectronics Symposium, Jul. 1985, pp. 73–76.

Hiroshi Ochi, et al., "Low Temperature Co–Fireable Multilayer Ceramic Substrate with Internal Capacitor," Matsushita–Kotobuki Electronics Ind., Ltd., WB2–2, pp. 70–72.

Hideo Suzuki, et al., Japan Ceramic Association 1990, p. 3, "Development of Glass Ceremics Board Containing Capacitor", May 23–25, 1990.

Seiichi Nakatani, et al., Materials and Devices Research Laboratory, pp. 219–223, "Co–Fireable Copper Multilayered Ceramic Substrate Containing Capacitor".

Primary Examiner—Timothy M. Speer
Attorney, Agent, or Firm—Oblon, Spivak, McClelland, Maier & Neustadt, P.C.

[57] ABSTRACT

A glass composition for a substrate with a built-in lead-dielectric material, containing up to 35 mol % calculated as $Al_2O_3$ of aluminum oxide, 20 to 60 mol % calculated as CaO of calcium oxide, and 8 to 40 mol % calculated as $SiO_2$ of silicon oxide.

17 Claims, 1 Drawing Sheet

US 5,948,536

GLASS COMPOSITION FOR SUBSTRATES WITH A BUILT-IN LEAD BASE DIELECTRIC MATERIAL, AND MULTILAYER SUBSTRATE WITH A BUILT-IN CAPACITOR

BACKGROUND OF THE INVENTION

1. Field of the Invention

This invention relates to a multilayer substrate having a capacitor section.

2. Description of the Background

For increasing the wiring density of circuit substrates, it was proposed in Electroceramics, vol. 18, No. 5 (1987) to build capacitors in multilayer substrates. When such multilayer substrates are prepared, the conductor material, dielectric material and substrate material must be concurrently fired. Since the firing temperature used is generally below the melting point of the conductor material, glass-ceramic composite substrate materials having a low firing temperature must be used when silver and silver-palladium having a low melting point despite satisfactory properties and low cost are used as the conductor material. The glass-ceramic composite substrates contain glass powder as well as a filler such as $Al_2O_3$. Glass powder in which the total content of $SiO_2$ and $B_2O_3$ is more than about 30% by weight as described, for example, in JP-A 230606/1990 is often used as the glass powder in order to reduce the softening point and improve the wettability to the filler.

On the other hand, dielectric materials having a high dielectric constant must be used in order to produce compact high-capacity capacitors. For example, lead-base perovskite compounds are deemed promising since they have a dielectric constant of higher than 10,000 and can be co-fired with silver. (See Circuit Technology, 6, 1, 28 (1991); the 1st Microelectronics Symposium (July 1985, Tokyo), p73; and IEMT Symposium (1993, Kanazawa), p70.)

Further when lead-base perovskite compounds are utilized as thick film devices (functional films of about 10 $\mu$m to about 30 $\mu$m thick) such as capacitors, a binder such as glass and sintering aids must be added thereto.

SUMMARY OF THE INVENTION

However, as a result of reaction with $SiO_2$ and $B_2O_3$ in glass-ceramic composite substrates or $SiO_2$ previously added to dielectrics as a sintering aid (see Journal of Japanese Ceramic Society, 94, 9, 936 (1986)), the perovskite phase is decomposed into a pyrochlore phase whereby the dielectric constant of the buried dielectric is reduced to about 1,700 to about 2,000. Then a desired capacity cannot be established. When design is made with a capacity reduction previously taken into account, the effective area of dielectric must be increased, becoming an undesirable hindrance against the size reduction of substrates.

Then, in connection with a multilayer substrate in which a capacitor section having a lead-base perovskite compound-containing dielectric layer is built, the present invention provides a glass composition for a lead-base dielectric buried substrate which can restrain the dielectric layer from reducing its dielectric constant upon firing, a capacitor built-in multilayer substrate comprising the glass composition, and a capacitor built-in multilayer substrate further comprising a readily sinterable dielectric material.

Making extensive investigations on a glass composition for a lead-base dielectric buried substrate and taking into account the fact that firing causes a glass composition contained in the substrate to diffuse and penetrate into the dielectric layer whereby the lead-base perovskite compound is decomposed to form a pyrochlore compound having a low dielectric constant, we have found that the decomposition of the perovskite compound is prohibited by using a novel glass composition as defined below as the substrate material. The present invention is predicated on this finding.

These and other objects are achieved by the present invention which is constructed as (1) to (10) below.

(1) A glass composition for a substrate with a built-in lead-base dielectric material, comprising 10 to 35 mol % calculated as $Al_2O_3$ of aluminum oxide, 20 to 60 mol % calculated as CaO of calcium oxide, and 8 to 40 mol % calculated as $SiO_2$ of silicon oxide.

(2) The glass composition for a substrate with a built-in lead-base dielectric material of (1), further comprising less than 30 mol % calculated as MgO, BaO, and SrO of at least one oxide selected from magnesium oxide, barium oxide, and strontium oxide.

(3) The glass composition for a substrate with a built-in lead-base dielectric material of (2), further comprising less than 10 mol % calculated as $TiO_2$ of titanium oxide.

(4) A glass-ceramic composite substrate composition comprising 60 to 90% by volume of the glass composition for a substrate with a built-in lead-base dielectric material of (1).

(5) A multilayer substrate with internal capacitor obtained by concurrently firing the substrate composition of (4) and a lead-base dielectric composition.

(6) The multilayer substrate with internal capacitor of (5) wherein said lead-base dielectric composition contains at least a lead-base perovskite compound and lead silicate.

(7) The multilayer substrate with internal capacitor of (6) wherein said lead silicate is comprised of 18 to 43 mol % calculated as $SiO_2$ of silicon oxide, 55 to 80 mol % calculated as PbO of lead oxide, and 1 to 5 mol % calculated as $Al_2O_3$ of aluminum oxide, and the content of said lead silicate is 3 to 20% by weight.

(8) The multilayer substrate with internal capacitor of (6) wherein said lead silicate is comprised of 10 to 40 mol % calculated as $SiO_2$ of silicon oxide, 50 to 75 mol % calculated as PbO of lead oxide, 1 to 15 mol % calculated as $Al_2O_3$ of aluminum oxide, and 1 to 20 mol % calculated as CuO of copper oxide, and the content of said lead silicate is 3 to 20% by weight.

(9) The multilayer substrate with internal capacitor of (6) wherein said lead silicate is comprised of 10 to 40 mol % calculated as $SiO_2$ of silicon oxide, 50 to 75 mol % calculated as PbO of lead oxide, 1 to 15 mol % calculated as $Al_2O_3$ of aluminum oxide, and 1 to 20 mol % in total calculated as CuO and $AgO_{1/2}$ of copper oxide and/or silver oxide, and the content of said lead silicate is 3 to 20% by weight.

(10) A multilayer substrate with internal capacitor comprising a capacitor section between a pair of glass-ceramic composite substrates having a dielectric layer and electrode layers, and buffer layers between said capacitor section and the respective glass-ceramic composite substrates, wherein said dielectric layer contains a lead-base perovskite compound and said buffer layer is a substrate formed of the glass-ceramic composite substrate composition of (4).

FUNCTION AND ADVANTAGES

The glass composition for lead-base dielectric buried substrates according to the invention is a glass composition which does not cause a lead-base perovskite compound to be decomposed even when it is co-fired with the lead-base perovskite compound. Accordingly, the lead-base perovskite compound buried in the glass-ceramic composite substrate using this glass composition is restrained from decomposition and presents its original high dielectric constant.

Further, the containment of lead silicate in the buried dielectric material is effective for improving the sinterability of the lead-base perovskite compound and increasing the dielectric constant of the buried dielectric material.

In a still further embodiment of the invention, a substrate material containing a glass composition which does not cause decomposition of the lead-base perovskite compound can be provided as a buffer layer between the capacitor section and the glass-ceramic composite substrate which can cause decomposition of the dielectric. This embodiment is also successful in achieving a high dielectric constant because the decomposition of the lead-base perovskite compound is restrained or retarded.

Consequently, the buried dielectric material maintains a high dielectric constant, allowing the substrate to be reduced in size.

DESCRIPTION OF THE PREFERRED EMBODIMENTS

The construction of the invention is described below in detail.

Figure 1:
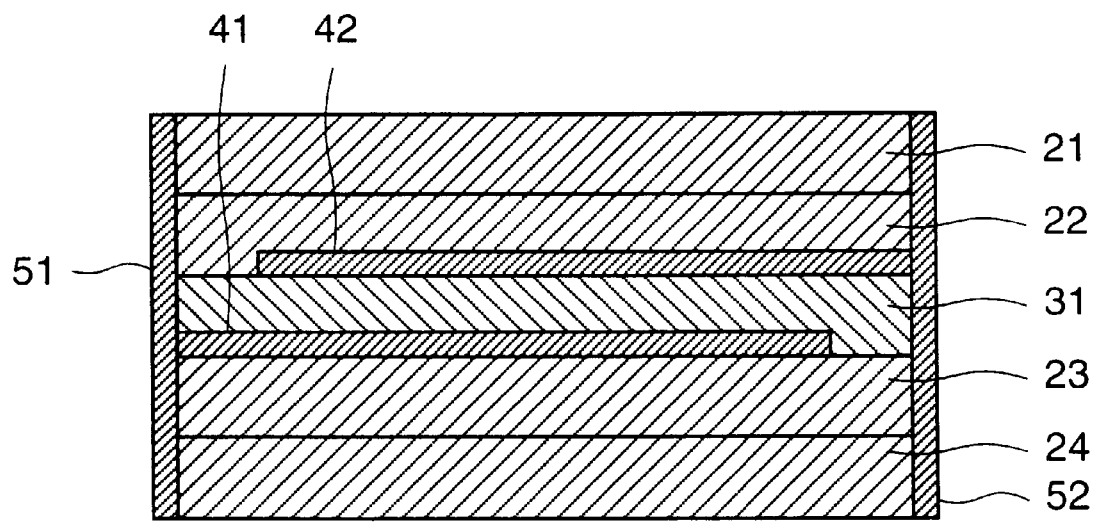
FIG. 1 is a cross-sectional view showing one exemplary construction of the multilayer substrate having a capacitor section built therein according to the invention.

FIG. 1 is a cross-sectional view of a capacitor built-in multilayer substrate according to the invention. In FIG. 1, a dielectric layer 31 is interleaved between electrodes 41 and 42 to construct a capacitor section, which is, in turn, interleaved between glass-ceramic composite substrates 21, 22 and 23, 24. End electrodes 51 and 52 are disposed on outside surfaces of the glass-ceramic composite substrates 21 to 24 and connected to the internal electrodes 41 and 42, respectively.

The multilayer substrate according to the invention is generally prepared by a printing method or a sheet method. The printing method involves alternatively printing a conductor paste and a dielectric paste on a green sheet of glass-ceramic composite substrate containing a glass composition causing no decomposition of lead-base perovskite compounds until a predetermined number of layers is reached, stacking such green sheets of glass-ceramic composite substrate containing a glass composition causing no decomposition of lead-base perovskite compounds, and firing the stack. On the other hand, the sheet method involves printing a conductor paste on a green sheet of dielectric material, printing the conductor paste on a green sheet of glass-ceramic composite substrate containing a glass composition causing no decomposition of lead-base perovskite compounds, stacking such green sheets of dielectric material having the conductor paste printed thereon on the glass-ceramic composite substrate sheet having the conductor paste printed thereon until a predetermined number of layers is reached, further stacking an unprinted green sheet of glass-ceramic composite substrate, and firing the stack. At the end of firing, an end electrode-forming paste is applied to surfaces of the glass-ceramic composite substrates in a predetermined pattern and fired thereto to form end electrodes. It is noted that the end electrodes may be co-fired with the glass-ceramic composite substrate and the dielectric layer.

The substrate material which forms the glass-ceramic composite substrate upon firing contains an oxide filler and glass powder.

The glass powder used as the substrate material, that is, the glass composition for a lead-base dielectric buried substrate according to the invention which does not cause decomposition of lead-base perovskite compounds contains $Al_2O_3$, CaO and $SiO_2$.

The content of $Al_2O_3$ is 10 to 35 mol %, preferably 10 to 20 mol %. With a $Al_2O_3$ content outside this range, the glass tends to crystallize, preventing the substrate from being densely fired.

The content of CaO is 20 to 60 mol %, preferably 20 to 35 mol %. With a CaO content outside this range, the glass tends to crystallize, preventing the substrate from being densely fired.

The content of $SiO_2$ is 8 to 40 mol %, preferably 15 to 40 mol %. Below the lower limit of this range, the glass tends to crystallize, preventing the substrate from being densely fired. Beyond the upper limit of this range, the lead-base dielectric material can be decomposed by $SiO_2$ in the glass composition.

Preferably the above-mentioned glass powder used as the substrate material further contains at least one oxide selected from MgO, BaO and SrO. This is because the glass then becomes unlikely to crystallize and stable. The oxide content is less than 30 mol %. The oxides are preferably contained in the composition in such a range as to provide 10 to 20 mol % of MgO, 5 to 15 mol % of BaO, and 0 to 5 mol % of SrO.

Also preferably, the glass powder further contains $TiO_2$. This is because the glass is then lowered in softening point and becomes unlikely to crystallize and stable. The content of $TiO_2$ is less than 10 mol %, preferably less than 5 mol %. The lower limit of the addition amount is preferably 1 mol %. Beyond the range, the glass rather becomes likely to crystallize. Below the lower limit, its effect on glass stability is little.

With formability and the like taken into account, the glass powder used has a mean particle size of about 1 to 3 $\mu$m.

The content of glass powder relative to the entire substrate material is preferably 60 to 90% by volume. The less the glass powder, the poorer becomes sinterability. The more the glass powder, the lower becomes the deflective strength of glass-ceramic composite substrates.

Examples of the oxide filler include $Al_2O_3$, forsterite, mullite, and cordierite alone or in admixture of two or more. The oxide filler used herein may have a composition somewhat deviated from its stoichiometry, a mixture of the stoichiometric composition and a deviated composition, or a mixture of deviated compositions.

Preferred combinations of glass powder with the oxide filler are combinations of 20 to 30% by volume of $Al_2O_3$ with 70 to 80% by volume of the glass component where $Al_2O_3$ is used as the oxide filler.

It is noted that $Al_2O_3$ is contained in both the glass composition and the filler although no interaction occurs between them.

Preferably the oxide filler has a mean particle size of about 0.5 to 3 $\mu$m. With a too smaller mean particle size, there is a tendency of sheet formation becoming difficult. With a too larger mean particle size, glass-ceramic composite substrates tend to have low strength.

A vehicle is added to the oxide filler and the glass powder to form a slurry, which is shaped and dried into a green sheet. The vehicle used contains a binder and a solvent. Examples of the binder include ethyl cellulose, polyvinyl butyrate, methacrylic resin, and butyl methacrylate. Examples of the solvent include terpineol, butyl carbitol, butyl carbitol acetate, toluene, alcohol and xylene. In addition to the binder and solvent, various additives such as dispersants, activators, and plasticizers are added to the vehicle if desired. The slurry preferably contains about 10 to 20% by weight of the vehicle.

The glass-ceramic composite substrate preferably has a thickness of 30 to 300 $\mu$m. A too thin glass-ceramic composite substrate is insufficient in deflective strength and difficult to handle whereas a too thick substrate is inefficient in binder removal.

On the other hand, a lead-base perovskite compound is used as the dielectric material to be buried in the substrate. Of the lead-base perovskite compounds, those compounds represented by the stoichiometric composition: $Pb(Mg_{1/3}Nb_{2/3})O_3$, $Pb(Fe_{1/3}W_{2/3})O_3$, and $Pb(Fe_{1/3}Nb_{2/3})O_3$ are readily decomposable. Thus where at least one of such compounds is used, the use of the glass composition according to the invention becomes more advantageous. The dielectric material used herein is also comprised of the lead-base perovskite compound and $PbTiO_3$, CuO, PbO, lead silicate or Ag added thereto. $PbTiO_3$ is effective for raising the Curie temperature while CuO, PbO, lead silicate and Ag are effective for improving sinterability. Where these compounds are added, the content of the lead-base perovskite compound is preferably at least 70% by weight, especially 70 to 95% by weight. Contents of less than 70% by weight fail to achieve a high dielectric constant. The lead-base perovskite compound may have a composition somewhat deviated from its stoichiometry.

Of the above-mentioned additives, lead silicate is preferably contained especially for improving the sinterability of the dielectric material. The lead silicate used herein is an amorphous glass or crystalline glass containing $SiO_2$ and PbO as major components.

The lead silicate used herein is preferably $SiO_2$—PbO—$Al_2O_3$ or $SiO_2$—PbO—$Al_2O_3$—CuO. Its content is 3 to 20% by weight.

$SiO_2$—PbO—$Al_2O_3$ consists of 18 to 43 mol %, more preferably 28 to 37 mol % of $SiO_2$, 55 to 80 mol %, more preferably 58 to 62 mol % of PbO, and 1 to 5 mol %, more preferably 1.5 to 3.5 mol % of $Al_2O_3$.

Too smaller contents of $SiO_2$ would raise the liquid phase forming temperature and lessen the sintering aid effect whereas too larger contents of $SiO_2$ would render the lead-base perovskite compound decomposable.

Too smaller contents of PbO would render the lead-base perovskite compound decomposable whereas with too larger contents of PbO, the contents of the other essential components $SiO_2$ and $Al_2O_3$ are reduced and the sintering aid effect would become less.

Too smaller contents of $Al_2O_3$ would be less effective for lowering the liquid phase forming temperature whereas too larger contents of $Al_2O_3$ would raise the liquid phase forming temperature and lessen the sintering aid effect.

The compound obtained by adding CuO to the above-mentioned lead silicate, that is, $SiO_2$—PbO—$Al_2O_3$—CuO consists of 10 to 40 mol %, more preferably 25 to 35 mol % of $SiO_2$, 50 to 75 mol %, more preferably 55 to 65 mol % of PbO, 1 to 15 mol %, more preferably 3 to 4 mol % of $Al_2O_3$, and 1 to 20 mol %, more preferably 1.5 to 17 mol % of CuO.

The contents of $SiO_2$, PbO and $Al_2O_3$ are limited for the same reason as above. CuO also plays the role of a sintering aid. Too smaller contents of CuO would be less effective for lowering the liquid phase forming temperature whereas too larger contents of CuO would raise the liquid phase forming temperature and lessen the sintering aid effect.

Also, the CuO-added lead silicate which is partially replaced by $AgO_{1/2}$, that is, $SiO_2$—PbO—$Al_2O_3$ having CuO and $AgO_{1/2}$ added in admixture also gives the same advantages as the lead silicate having only CuO added thereto. The content of CuO and $AgO_{1/2}$ combined is approximate to the content of CuO added alone, preferably 3 to 8 mol % while the CuO content is preferably 2 to 6 mol %.

The content of lead silicate is preferably 3 to 20% by weight. Too smaller contents below this range fail to achieve the additive effect, that is, sinterability improvement whereas too larger contents above this range would result in a lower dielectric constant.

The lead-base perovskite compound and lead silicate preferably have a mean particle size of 0.1 to 10 $\mu$m. A too smaller mean particle size would impede binder removal whereas a too greater mean particle size would exacerbate sinterability.

A dielectric slurry which forms a dielectric layer upon firing contains a dielectric material and a vehicle.

The vehicle used for the dielectric slurry may be selected from those exemplified in conjunction with the slurry for glass-ceramic composite substrates.

The thickness of the dielectric layer may be appropriately determined in accordance with the desired capacity or the like although it is preferably 10 to 60 $\mu$m. A too thin dielectric layer is difficult to form a uniform layer whereas a too thick dielectric layer leads to a thicker multilayer substrate, impeding size reduction.

A conductor paste which forms an electrode layer upon firing contains a conductor powder and a vehicle.

As the conductor powder, Ag particles, Ag particles in admixture with Pd particles, Ag—Pd alloy particles, or Ag—Pd alloy particles in admixture with Ag particles and/or Pd particles are preferably used since they are well conductive and inexpensive. The contents of the respective metals in the entire conductor powder are preferably Ag: 80 to 100% by weight and Pd: 0 to 20% by weight.

A lower content of silver leads to a higher resistance. Palladium is not essential, but the inclusion of palladium is effective when the firing temperature of the glass-ceramic composite substrate is relatively high since palladium serves to reduce the migration of silver and raise the sintering temperature of the conductor paste. The mean particle size of the conductor powder (a mean major axis diameter when particles have shape anisotropy) is not particularly limited although it is generally about 0.1 to 5 $\mu$m. No particular limit is imposed on the shape of particles although spherical particles are usually preferred. It is noted that part or all of conductor particles may be flakes.

In the vehicle of the conductor paste, an acrylic resin may be used as the binder and terpineol or butyl carbitol acetate be used as the solvent.

The thickness of the electrode is not particularly limited although it is generally about 3 to 20 µm.

Firing is generally carried out in air. The firing temperature is preferably at least 800° C. and may be properly determined in accordance with a particular composition of conductor powder. The firing time is generally about 10 to 30 minutes. Understandably, firing may be done two or more times.

Although only one dielectric layer is shown in the illustrated embodiment, a construction having two or more dielectric layers is acceptable.

Figure 2:
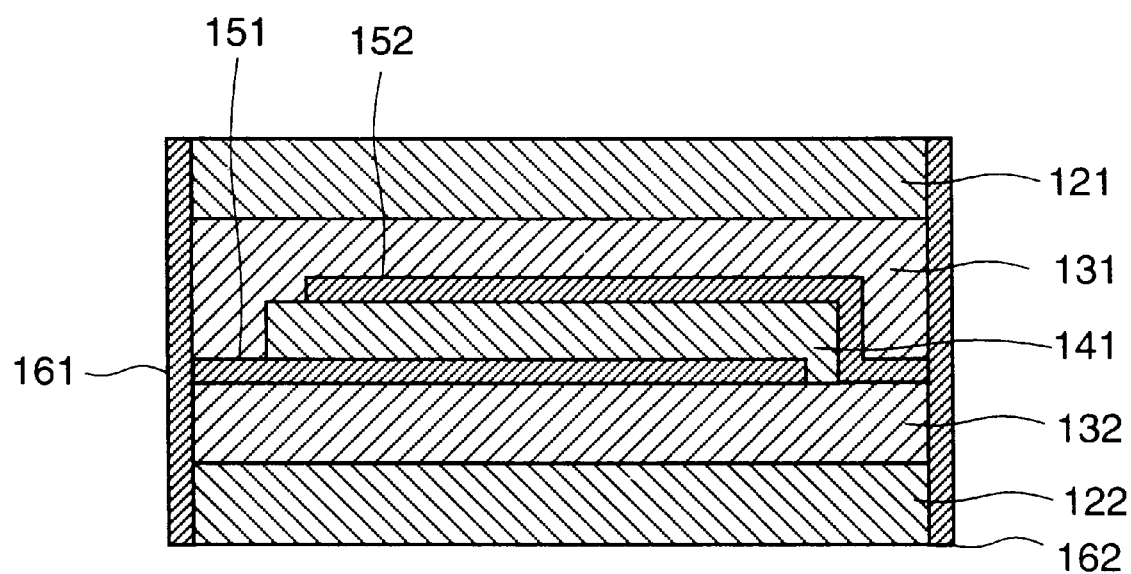
FIG. 2 is a cross-sectional view showing another exemplary construction of the multilayer substrate having a capacitor section built therein according to the invention.

Referring to FIG. 2, a substrate can be fabricated using as a buffer layer a substrate comprising the above-mentioned lead-base dielectric buried substrate-forming glass composition causing no decomposition of lead-base perovskite compounds. In FIG. 2, a dielectric layer 141 is interleaved between electrodes 151 and 152 to construct a capacitor section, which is, in turn, interleaved between buffer layers 131 and 132 comprising a lead-base dielectric buried substrate-forming glass composition causing no decomposition of lead-base perovskite compounds according to the invention and further interleaved between glass-ceramic composite substrates 121 and 122 of a conventional composition. End electrodes 161 and 162 are disposed on outside surfaces and connected to the internal electrodes 151 and 152, respectively.

The multilayer substrate having buffer layers according to the invention is generally prepared by a printing method or a sheet method. The printing method involves alternatively printing a conductor paste and a dielectric paste on a green sheet of buffer material until a predetermined number of layers is reached, and stacking a green sheet of glass-ceramic composite substrate, an unprinted green sheet of buffer material, a printed green sheet of buffer material, and another green sheet of glass-ceramic composite substrate in this order, followed by firing. On the other hand, the sheet method involves printing a conductor paste on a green sheet of dielectric material, printing the conductor paste on a green sheet of buffer material, and stacking a green sheet of glass-ceramic composite substrate, a green sheet of buffer material, a conductor paste-printed green sheet of dielectric material, a conductor paste-printed green sheet of buffer material, and another green sheet of glass-ceramic composite substrate in this order, followed by firing. At the end of firing, an end electrode-forming paste is applied to surfaces of the glass-ceramic composite substrate in a predetermined pattern and fired thereto to form end electrodes. It is noted that the end electrodes may be co-fired with the glass-ceramic composite substrate and the dielectric layer.

It is understood that various conditions including the composition of buffer material, the particle size of stock material, the composition of a vehicle used in forming paste, and the thickness of buffer layers may be similar to those of the glass-ceramic composite substrate designed so as to avoid the decomposition of lead-base perovskite compounds.

Further, conditions including the composition of buried dielectric material and electrode-forming paste are approximate to those described for the capacitor built-in multilayer substrate.

In the manufacture of the capacitor built-in multilayer substrate having buffer layers, the substrate material which forms glass-ceramic composite substrates upon firing is not critical insofar as it can be co-fired with the Ag base electrode material. In general, a substrate material containing an oxide filler and a glass powder is used.

The glass powder used as the substrate material is not critical and may be any of conventional compositions used in prior art glass-ceramic composite substrates. More illustratively, with the deflective strength of glass-ceramic composite substrates, wettability to the oxide, and adhesion to end electrodes taken into account, a choice may be made among glasses having a softening point of about 750 to 850° C. Such glass powder is exemplified by the $SiO_2$—SrO—$Al_2O_3$—$B_2O_3$—CaO—BaO glass composition disclosed in JP-A 122194/1989, for example.

The oxide filler is not critical and includes, for example, $Al_2O_3$, forsterite, quartz, mullite, cordierite, $R_2Ti_2O_7$ wherein R is at least one lanthanide, $Ca_2Nb_2O_7$, $MgTiO_3$, $SrZrO_3$, $TiO_2$, $SnO_2.TiO_2$, $ZrTiO_4$, $Ba_2Ti_9O_{20}$, $Sr_2Nb_2O_7$, $CaTiO_3$, $SrTiO_3$, $SrSnO_3$, and $BaO.R_2O_3.nTiO_2$ wherein R is at least one lanthanide, alone or in admixture of two or more. The oxide filler used herein may a mixture of the stoichiometric composition and a somewhat deviated composition or a mixture of deviated compositions.

Preferably the oxide filler has a mean particle size of about 0.5 to 3 µm. With a too smaller mean particle size, there is a tendency of sheet formation becoming difficult. With a too larger mean particle size, glass-ceramic composite substrates tend to have low strength.

A vehicle is added to the oxide filler and the glass powder to form a slurry, which is shaped and dried into a green sheet. The vehicle used may be the same as described for the slurry which is to form substrates comprising the lead-base dielectric buried substrate-forming glass composition designed so as to avoid the decomposition of lead-base perovskite compounds.

In the capacitor built-in multilayer substrate having buffer layers, the glass-ceramic composite substrate preferably has a thickness of 30 to 300 µm. A too thin glass-ceramic composite substrate is insufficient in deflective strength and difficult to handle whereas a too thick substrate is inefficient in binder removal.

Although only one dielectric layer is shown in the illustrated embodiment, a construction having two or more dielectric layers is acceptable.

EXAMPLE

Examples of the invention are given below by way of illustration.

Example 1

A capacitor built-in multilayer substrate of the structure shown in FIG. 1, that is, a capacitor built-in multilayer substrate using a glass-ceramic composite substrate comprising a glass composition which does not cause decomposition of lead-base perovskite compounds upon co-firing was fabricated as follows.

Glass Composition

Raw materials (oxides) were weighed so as to give the composition shown in Table 1 and mixed using a shaker mixer. The mixture was melted in a crucible at 1,500 to 1,600° C. for ½ to 5 hours (properly selected in this range in accordance with a glass composition), quenched with water, dry pulverized in an attriter, and milled in a ball mill (ethanol medium), obtaining a glass composition powder having a mean particle size of about 1.6 µm.

In Table 1, glass Nos. 1 to 24 are lead-base dielectric buried substrate-forming glass compositions within the scope of the invention whereas glass Nos. 25 and 26 are prior art glass compositions.

Under the heading "Decomposition" in Table 1, whether decomposition "occurred" or "not" was judged as follows.

If a glass-ceramic composite substrate and a lead-base perovskite compound are co-fired using a prior art glass composition, then $SiO_2$ in the substrate reacts with the lead-base perovskite compound to decompose the latter. An observation by an electron probe microanalyzer (EPMA) showed that the amount of $SiO_2$ diffused from the substrate into the lead-base perovskite compound was 6 wt %. Then a glass composition was added to the lead-base perovskite compound in an amount corresponding to the diffused $SiO_2$ amount, and firing was done in accordance with the substrate firing pattern. It was determined by X-ray diffractometry whether or not the lead-base perovskite compound was decomposed.

The crystallization temperature Tx and softening temperature Ts of glass were measured by TG-DTA.

3) to 100 parts by weight of 95 mol % $Pb(Mg_{1/3}Nb_{2/3})O_3$-5 mol % $PbTiO_3$ (mean particle size 1.0 μm). A green sheet of about 60 μm thick was prepared by adding a vehicle to the dielectric material and sheeting the mixture by a doctor blade technique, followed by drying. The vehicle used contained an acrylic resin as the binder, ethyl alcohol and toluene as the solvent and a phthalic ester as the plasticizer.

Preparation of Substrate

The conductor paste was printed on a glass-ceramic composite substrate-forming green sheet and a dielectric sheet. Sheets were stacked in the order of an unprinted glass-ceramic composite substrate-forming green sheet, an unprinted glass-ceramic composite substrate-forming green

TABLE 1

| Glass No. | Al$_2$O$_3$ | CaO | SiO$_2$ | MgO | BaO | SrO | TiO$_2$ | B$_2$O$_3$ | K$_2$O | Decomposition | Tx – Ts (° C.) |
|---|---|---|---|---|---|---|---|---|---|---|---|
| 1 | 34.2 | 57.7 | 8.1 | | | | | | | not | 107 |
| 2 | 30 | 48 | 15 | 7 | | | | | | not | 99 |
| 3 | 16.6 | 40.1 | 29.7 | 13.6 | | | | | | not | 99 |
| 4 | 21 | 44 | 15 | 15 | | 5 | | | | not | 117 |
| 5 | 21 | 44 | 15 | 15 | 5 | | | | | not | 144 |
| 6 | 16.6 | 35.1 | 29.7 | 13.6 | 5 | | | | | not | 149 |
| 7 | 16.6 | 30.1 | 29.7 | 13.6 | 10 | | | | | not | 172 |
| 8 | 13.6 | 28.1 | 29.7 | 13.6 | 15 | | | | | not | 124 |
| 9 | 13.6 | 28.1 | 29.7 | 13.6 | 10 | 5 | | | | not | 123 |
| 10 | 13.6 | 30.1 | 29.7 | 13.6 | 10 | | 3 | | | not | 174 |
| 11 | 19.6 | 27.1 | 29.7 | 13.6 | 10 | | | | | not | 170 |
| 12 | 13.6 | 33.1 | 29.7 | 13.6 | 10 | | | | | not | 157 |
| 13 | 17.6 | 32.1 | 26.7 | 13.6 | 10 | | | | | not | 157 |
| 14 | 18.6 | 34.1 | 23.7 | 13.6 | 10 | | | | | not | 168 |
| 15 | 17.6 | 32.1 | 29.7 | 10.6 | 10 | | | | | not | 156 |
| 16 | 15.6 | 28.1 | 29.7 | 16.6 | 10 | | | | | not | 170 |
| 17 | 10.6 | 30.1 | 29.7 | 13.6 | 10 | | 6 | | | not | 144 |
| 18 | 13.6 | 27.1 | 29.7 | 16.6 | 10 | | 3 | | | not | 179 |
| 19 | 12.6 | 25.1 | 29.7 | 19.6 | 10 | | 3 | | | not | 162 |
| 20 | 17.6 | 23.1 | 29.7 | 16.6 | 10 | | 3 | | | not | 199 |
| 21 | 13.3 | 27.1 | 33 | 16.6 | 10 | | | | | not | 181 |
| 22 | 13.3 | 27.1 | 35 | 14.6 | 10 | | | | | not | 183 |
| 23 | 13.3 | 27.1 | 37 | 12.6 | 10 | | | | | not | 183 |
| 24 | 12.3 | 25.1 | 40 | 12.6 | 10 | | | | | not | 142 |
| 25* | 8 | 4 | 62 | 3 | | 20 | | 3 | | occurred | 210 |
| 26* | 10.66 | 15.98 | 44.39 | | | 15.98 | | 5 | 7.99 | occurred | 190 |

*prior art example
Tx: crystallization temperature
Ts: softening temperature

Green Sheet for Glass-ceramic Composite Substrate

A green sheet of about 250 μm thick was prepared by adding a vehicle to a mixture of 30% by volume of $Al_2O_3$ and 70% by volume of a glass powder of the glass composition shown in Table 1, kneading the mixture, and sheeting the mixture by a doctor blade technique, followed by drying. The vehicle used contained an acrylic resin as the binder, ethyl alcohol and toluene as the solvent and a phthalic ester as the plasticizer.

Conductor Paste

A paste was prepared by adding a vehicle to conductor powder (silver powder having a mean particle size of 3.5 μm) and milling the mixture in a three-roll mill. The vehicle used contained an acrylic resin as the binder and terpineol and butyl carbitol acetate as the solvent.

Dielectric Sheet

The dielectric materials used were a dielectric material A obtained by adding 10 parts by weight of PbO and 0.3 part by weight of CuO to 100 parts by weight of 95 mol % $Pb(Mg_{1/3}Nb_{2/3})O_3$-5 mol % $PbTiO_3$ (mean particle size 1.0 μm) and a dielectric material B obtained by adding 7 parts by weight of lead glass (lead silicate No. 101 shown in Table sheet, a conductor paste-printed dielectric sheet, a conductor paste-printed glass-ceramic composite substrate-forming green sheet, and an unprinted glass-ceramic composite substrate-forming green sheet, compressed by a eat press, and fired at 900° C. for 10 minutes, yielding multilayer substrate samples.

An outer conductor paste was applied to side surfaces of each multilayer substrate sample and baked into end electrodes at 850° C. for 10 minutes, yielding capacitor built-in multilayer substrate samples (FIG. 1) reported as sample Nos. 1 to 29 in Table 2.

For comparison purposes, capacitor built-in multilayer substrate samples (Nos. 30 to 32 in Table 2) were also prepared using a glass-ceramic composite substrate sheet using a glass composition (a glass composition containing more than 40 mol % of $SiO_2$) which had been conventionally used as a low-temperature firing substrate-forming glass.

Test Method and Results

For each sample, the dielectric constant (ε) at 1 kHz of the dielectric layer was measured at room temperature using a LCR meter (HP-4284A by Hewlett Packard).

The measurement results of the samples are shown in Table 2.

The advantages of the invention are evident from the results of Example. Specifically, the dielectric materials which were co-fired with glass-ceramic composite substrates using conventional glass compositions had a dielectric constant of about 500 to 2,000 whereas the dielectric materials which were co-fired with glass-ceramic composite substrates within the scope of the invention had a significantly improved dielectric constant of about 5,000 to 11,000.

TABLE 2

| Substrate No. | Glass No. | Dielectric material | ε (1 kHz) |
|---|---|---|---|
| 1 | 1 | A | 5050 |
| 2 | 2 | A | 5030 |
| 3 | 3 | A | 5100 |
| 4 | 4 | A | 5110 |
| 5 | 5 | A | 5400 |
| 6 | 6 | A | 5110 |
| 7 | 7 | A | 5800 |
| 8 | 7 | B | 5600 |
| 9 | 8 | A | 5630 |
| 10 | 9 | A | 5500 |
| 11 | 10 | A | 7100 |
| 12 | 10 | B | 11200 |
| 13 | 11 | A | 5700 |
| 14 | 12 | A | 5620 |
| 15 | 13 | A | 5460 |
| 16 | 14 | A | 5150 |
| 17 | 15 | A | 5410 |
| 18 | 16 | A | 5330 |
| 19 | 17 | A | 7400 |
| 20 | 17 | B | 10050 |
| 21 | 18 | A | 6500 |
| 22 | 18 | B | 10100 |
| 23 | 19 | A | 7070 |
| 24 | 19 | B | 9580 |
| 25 | 20 | A | 5010 |
| 26 | 21 | A | 5320 |
| 27 | 22 | A | 5400 |
| 28 | 23 | A | 5190 |
| 29 | 24 | A | 5280 |
| 30* | 25 | A | 500 |
| 31* | 25 | B | 480 |
| 32* | 26 | A | 1900 |

*prior art examples
Dielectric material A: $Pb(Mg_{1/3}Nb_{2/3})O_3$—$PbTiO_3$—$PbO$
Dielectric material B: $Pb(Mg_{1/3}Nb_{2/3})O_3$—$PbTiO_3$-lead silicate having the composition of lead silicate No. 101 in Table 3.

Example 2

Capacitor built-in multilayer substrates of the structure shown in FIG. 1 were prepared as in Example 1 using dielectric materials containing a lead-base perovskite compound and a lead silicate which form high dielectric constant dielectric layers upon firing. There were furnished lead silicates having the composition shown in Table 3.

TABLE 3

| Lead silicate No. | Composition of lead silicate (mol %) | | | | | Dielectric material |
|---|---|---|---|---|---|---|
| | $SiO_2$ | PbO | $Al_2O_3$ | CuO | $AgO_{1/2}$ | |
| 101 | 28.2 | 62.0 | 3.8 | 6.0 | | B |
| 102 | 30.0 | 66.0 | 4.0 | | | C |
| 103 | 18.7 | 78.9 | 2.4 | | | D |
| 104 | 37.1 | 59.8 | 3.1 | | | E |
| 105 | 41.0 | 57.0 | 2.0 | | | F |
| 106 | 38.8 | 53.8 | 1.9 | 5.5 | | G |
| 107 | 25.0 | 67.1 | 1.6 | 6.3 | | H |
| 108 | 27.1 | 59.7 | 3.6 | 9.6 | | I |
| 109 | 24.7 | 54.4 | 3.3 | 17.6 | | J |

TABLE 3-continued

| Lead silicate No. | Composition of lead silicate (mol %) | | | | | Dielectric material |
|---|---|---|---|---|---|---|
| | $SiO_2$ | PbO | $Al_2O_3$ | CuO | $AgO_{1/2}$ | |
| 110 | 29.7 | 65.3 | 4.0 | 1.0 | | K |
| 111 | 35.0 | 56.4 | 2.9 | 5.7 | | L |
| 112 | 10.7 | 73.2 | 9.3 | 6.8 | | M |
| 113 | 10.7 | 71.4 | 11.2 | 6.7 | | N |
| 114 | 10.7 | 69.6 | 13.1 | 6.6 | | O |
| 115 | 28.2 | 58.4 | 7.5 | 5.9 | | P |
| 116 | 30.1 | 58.4 | 5.7 | 5.8 | | Q |
| 117 | 28.3 | 56.5 | 9.4 | 5.8 | | R |
| 118 | 28.9 | 63.6 | 3.9 | 2.1 | 1.5 | S |
| 119 | 27.8 | 61.1 | 3.7 | 5.9 | 1.5 | T |
| 120 | 28.3 | 54.7 | 11.3 | 5.7 | | U |
| 121 | 28.3 | 52.9 | 13.2 | 5.6 | | V |

Dielectric materials B to V contained $Pb(Mg_{1/3}Nb_{2/3})O_3$—$PbTiO_3$ as a major component and lead silicate Nos. 101 to 121 (B to V in the Table) as an auxiliary component.

Dielectric Sheet

The dielectric materials used were dielectric materials B to V in Table 3 which were obtained by adding 7 parts by weight of lead silicate shown in Table 3 (lead silicate Nos. 101 to 121 in Table 3) to 100 parts by weight of 95 mol % $Pb(Mg_{1/3}Nb_{2/3})O_3$-5 mol % $PbTiO_3$ (mean particle size 1.0 μm). Where the lead silicate did not contain CuO, 0.3% by weight of CuO was added. A green sheet of about 60 μm thick was prepared by adding a vehicle to each dielectric material and sheeting the mixture by a doctor blade technique, followed by drying. The vehicle used contained an acrylic resin as the binder, ethyl alcohol and toluene as the solvent and a phthalic ester as the plasticizer.

Green Sheet for Glass-ceramic Composite Substrate A green sheet of about 250 μm thick was prepared by adding a vehicle to a mixture of 30% by volume of $Al_2O_3$ and 70% by volume of a glass powder of the selected glass composition, kneading the mixture, and sheeting the mixture by a doctor blade technique, followed by drying. The vehicle used contained an acrylic resin as the binder, ethyl alcohol and toluene as the solvent and a phthalic ester as the plasticizer. The glass composition selected herein was glass No. 18 in Table 1, consisting of 29.7 mol % of $SiO_2$, 13.6 mol % of $Al_2O_3$, 27.1 mol % of CaO, 16.6 mol % of MgO, 10.0 mol % of BaO, and 3.0 mol % of $TiO_2$.

The remaining conditions including the composition and preparation of conductor paste and the preparation of substrates were the same as in Example 1.

Test Method and Results

For each sample, the dielectric constant (ε) at 1 kHz of the dielectric layer was measured. The meter used was the same as in Example 1.

The measurement results of the samples are shown in Table 4.

The advantages of the invention are evident from the results of Example. Specifically, samples using $Pb(Mg_{1/3}Nb_{2/3})O_3$—$PbTiO_3$—$PbO$ as the dielectric material were superior as previously mentioned (dielectric constant ~6,500). When dielectric materials in which PbO was replaced by lead silicates within the scope of claim 7 or 8, that is, a lead silicate consisting of 18 to 43 mol % of $SiO_2$, 55 to 80 mol % of PbO, and 1 to 5 mol % of $Al_2O_3$, or a lead silicate consisting of 10 to 40 mol % of $SiO_2$, 50 to 75 mol % of PbO, 1 to 15 mol % of $Al_2O_3$, and 1 to 20 mol % of CuO were used and co-fired with glass-ceramic composite substrates, the resulting dielectric layers were further improved as demonstrated by a dielectric constant of about 7,200 to 12,500 and about 6,700 to 11,500, respectively. The dielectric constant improved when CuO was partially replaced by $AgO_{1/2}$.

TABLE 4

| Substrate No. | Dielectric material | Lead silicate No. | ε (1 kHz) |
|---|---|---|---|
| 22 | B | 101 | 10100 |
| 33 | C | 102 | 7260 |
| 34 | D | 103 | 8780 |
| 35 | E | 104 | 12300 |
| 36 | F | 105 | 9250 |
| 37 | G | 106 | 8710 |
| 38 | H | 107 | 6690 |
| 39 | I | 108 | 8840 |
| 40 | J | 109 | 9870 |
| 41 | K | 110 | 9700 |
| 42 | L | 111 | 9360 |
| 43 | M | 112 | 7980 |
| 44 | N | 113 | 8520 |
| 45 | O | 114 | 7320 |
| 46 | P | 115 | 11140 |
| 47 | Q | 116 | 9300 |
| 48 | R | 117 | 7970 |
| 49 | S | 118 | 9210 |
| 50 | T | 119 | 11220 |
| 51 | U | 120 | 7530 |
| 52 | V | 121 | 6990 |
| 21 | A |  | 6500 |

Dielectric materials contained $Pb(Mg_{1/3}Nb_{2/3})O_3$—$PbTiO_3$—$PbO$ (A in the Table) as a major component and lead silicate Nos. 101 to 121 (B to V in the Table) as an auxiliary component.

The glass used in the substrate was glass No. 18 in Table 1.

Example 3

A capacitor built-in multilayer substrate of the structure shown in FIG. 2, that is, a capacitor built-in multilayer substrate having buffer layers was prepared as follows.

Preparation of Substrate having Buffer Layers

A conductor paste was printed on a green sheet of buffer material, a dielectric paste was printed thereon, and the conductor paste was again printed thereon. Sheets were stacked in the order of a glass-ceramic composite substrate-forming green sheet, an unprinted green sheet of buffer material, a conductor paste- and dielectric paste-printed green sheet of buffer material, and a glass-ceramic composite substrate-forming green sheet, compressed by a heat press, and fired at 900° C. for 10 minutes, yielding multilayer substrate samples.

An outer conductor paste was applied to side surfaces of each multilayer substrate sample and baked into end electrodes at 850° C. for 10 minutes, yielding capacitor built-in multilayer substrate samples (FIG. 2) reported as sample Nos. 53 to 81 in Table 5.

The glass compositions used as the buffer material were the same glass compositions as in Example 1, that is, the glass compositions shown in Table 1. The procedure of preparing buffer material green sheets was the same as the procedure of preparing glass-ceramic composite substrate-forming green sheets in Example 1. Also the conductor paste was prepared by the same procedure as in Example 1. The dielectric paste was prepared by adding a vehicle to the dielectric material of the composition in Example 1 and milling the mixture in a three-roll mill. The vehicle used contained an acrylic resin as the binder and terpineol and butyl carbitol acetate as the solvent.

The dielectric sheet was prepared by the same procedure as in Example 1.

The glass-ceramic composite substrate-forming green sheets were prepared by adding a vehicle to glass powder of a prior art composition, that is, consisting of 30% by volume of $Al_2O_3$ and 70% by volume of $SiO_2$—SrO—$Al_2O_3$—$B_2O_3$—CaO—BaO glass, kneading the mixture, and sheeting the mixture by a doctor blade technique, followed by drying. Green sheets of about 250 μm thick were obtained. The vehicle used contained an acrylic resin as the binder, ethyl alcohol and toluene as the solvent and a phthalic ester as the plasticizer.

Also prepared for comparison purposes were multilayer substrate samples in which a capacitor was directly built in a glass-ceramic composite substrate of the prior art composition (Nos. 82 and 83 in Table 5), that is, a capacitor was built in without interleaving a substrate comprising a lead-base dielectric buried substrate-forming glass composition which does not cause decomposition of lead-base perovskite compounds according to the invention (multilayer substrate samples free of buffer layers).

Test Method and Results

By the same test method as in Example 1, the dielectric constant (ε) at 1 kHz of the dielectric layer was measured for each sample. The results are shown in Table 5.

The advantages of the invention are evident from the results of Example. Specifically, the dielectric materials which were co-fired with glass-ceramic composite substrates of the prior art composition having a capacitor directly built therein (Nos. 82 and 83 in Table 5) had a dielectric constant of about 500 whereas the dielectric materials which were co-fired with the interleaving glass-ceramic composite substrates (as buffer layers) within the scope of the invention had a significantly improved dielectric constant of about 5,000 to 12,000.

Still further, as a matter of course, a high dielectric constant was maintained after co-firing when a lead-base perovskite compound containing the lead silicate was used as the dielectric material in the glass-ceramic composite substrates having buffer layers.

TABLE 5

| Substrate No. | Glass No. | Dielectric material | ε (1 kHz) |
|---|---|---|---|
| 53 | 1 | A | 5020 |
| 54 | 2 | A | 5140 |
| 55 | 3 | A | 5080 |
| 56 | 4 | A | 5220 |
| 57 | 5 | A | 5320 |
| 58 | 6 | A | 5200 |
| 59 | 7 | A | 5820 |
| 60 | 7 | B | 5580 |
| 61 | 8 | A | 5600 |
| 62 | 9 | A | 5480 |
| 63 | 10 | A | 7010 |
| 64 | 10 | B | 10010 |
| 65 | 11 | A | 5580 |
| 66 | 12 | A | 5410 |
| 67 | 13 | A | 5610 |
| 68 | 14 | A | 5080 |
| 69 | 15 | A | 5220 |
| 70 | 16 | A | 5410 |
| 71 | 17 | A | 7630 |
| 72 | 17 | B | 11130 |
| 73 | 18 | A | 6380 |
| 74 | 18 | B | 12000 |
| 75 | 19 | A | 7240 |
| 76 | 19 | B | 9830 |
| 77 | 20 | A | 6310 |
| 78 | 21 | A | 5190 |

TABLE 5-continued

| Substrate No. | Glass No. | Dielectric material | ε (1 kHz) |
|---|---|---|---|
| 79 | 22 | A | 5340 |
| 80 | 23 | A | 5620 |
| 81 | 24 | A | 5000 |
| 82* | — | A | 500 |
| 83* | — | B | 480 |

*prior art examples
Dielectric material A: Pb(Mg⅓Nb⅔)O₃—PbTiO₃—PbO
Dielectric material B: Pb(Mg⅓Nb⅔)O₃—PbTiO₃—PbO.SiO₂.Al₂O₃ glass

We claim:

1. A glass composition for a substrate with a built-in lead-dielectric material, consisting essentially of 10 to 35 mol % calculated as $Al_2O_3$ of aluminum oxide, 20 to 60 mol % calculated as CaO of calcium oxide, and 8 to 40 mol % calculated as $SiO_2$ of silicon oxide.

2. The glass composition for a substrate with a built-in lead-base dielectric material of claim 1, further comprising less than 30 mol % calculated as MgO, BaO, and SrO of at least one oxide selected from magnesium oxide, barium oxide, and strontium oxide.

3. The glass composition for a substrate with a built-in lead-base dielectric material of claim 2, further comprising less than 10 mol % calculated as $TiO_2$ of titanium oxide.

4. The glass composition for a substrate with a built-in lead-base dielectric material of claim 3, wherein said $TiO_2$ is present in an amount of less than 5 mol %.

5. The glass composition for a substrate with a built-in lead-base dielectric material of claim 2, which comprises 10 to 20 mol % of MgO, 5 to 15 mol % of BaO, and 0 to 5 mol % of SrO.

6. A glass-ceramic composite substrate composition comprising 60 to 90% by volume of the glass composition for a substrate with a built-in lead-base dielectric material of claim 1.

7. A multilayer substrate with internal capacitor obtained, by concurrently firing the substrate composition of claim 6 and a lead-base dielectric composition.

8. The multilayer substrate with internal capacitor of claim 7, wherein said lead-base dielectric composition contains at least a lead-base perovskite compound and lead silicate.

9. The multilayer substrate with internal capacitor of claim 8, wherein said lead silicate is comprised of 18 to 43 mol % calculated as $SiO_2$ of silicon oxide, 55 to 80 mol % calculated as PbO of lead oxide, and 1 to 5 mol % calculated as $Al_2O_3$ of aluminum oxide, and the content of said lead silicate is 3 to 20% by weight.

10. The multilayer substrate with internal capacitor of claim 8, wherein said lead silicate is comprised of 10 to 40 mol % calculated as $SiO_2$ of silicon oxide, 50 to 75 mol % calculated as PbO of lead oxide, 1 to 15 mol % calculated as $Al_2O_3$ of aluminum oxide, and 1 to 20 mol % calculated as CuO of copper oxide, and the content of said lead silicate is 3 to 20% by weight.

11. The multilayer substrate with internal capacitor of claim 8, wherein said lead silicate is comprised of 10 to 40 mol % calculated as $SiO_2$ of silicon oxide, 50 to 75 mol % calculated as PbO of lead oxide, 1 to 15 mol % calculated as $Al_2O_3$ of aluminum oxide, and 1 to 20 mol % in total calculated as CuO and $AgO_{1/2}$ of copper oxide or silver oxide or both, and the content of said lead silicate is 3 to 20% by weight.

12. A multilayer substrate with internal capacitor comprising a capacitor section between a pair of glass-ceramic composite substrates having a dielectric layer and electrode layers, and buffer layers between said capacitor section and the respective glass-ceramic composite substrates, wherein said dielectric layer contains a lead-base perovskite compound and said buffer layer is a substrate formed of the glass-ceramic composite substrate composition of claim 6.

13. The glass-ceramic composite substrate composition of claim 6, having a thickness of 30–300 μm.

14. The glass-ceramic composite substrate composition of claim 6, wherein said built-in lead-base dielectric material comprises a lead-base perovskite compound, $PbTiO_3$, CaO, PbO, lead silicate or Ag.

15. The glass-ceramic composite substrate composition of claim 14, wherein said lead-base perovskite compound is present in an amount of at least 70% by weight.

16. The glass composition for a substrate with a built-in lead-base dielectric material of claim 1, which comprises from 10 to 20 mol % of $Al_2O_3$, from 20 to 35 mol % of CaO, and from 15 to 40 mol % of $SiO_2$.

17. The glass composition for a substrate with a built-in lead-base dielectric material of claim 1, which is in a form of a powder having a mean particle size of about 1 to 3 μm.

* * * * *